United States Patent [19]
Villa et al.

[11] Patent Number: 5,784,319
[45] Date of Patent: Jul. 21, 1998

[54] METHOD FOR ERASING AN ELECTRICALLY PROGRAMMABLE AND ERASABLE NON-VOLATILE MEMORY CELL

[75] Inventors: Corrado Villa, Sovico; Roberto Bez, Milan; Daniele Cantarelli, Villasanta; Marco Dallabora, Carpiano, all of Italy

[73] Assignee: SGS-Thomson Microelectronics S.r.l., Agrate-Brianza, Italy

[21] Appl. No.: 788,530

[22] Filed: Jan. 24, 1997

[30] Foreign Application Priority Data

Jan. 24, 1996 [EP] European Pat. Off. ............. 96830024

[51] Int. Cl.⁶ ................................................ G11C 16/06
[52] U.S. Cl. ...................... 365/185.33; 365/185.29; 365/185.26; 365/185.23; 365/185.21
[58] Field of Search ........................ 365/218, 189.01, 365/189.09, 226, 185.29, 219, 185.33, 185.01, 185.26, 185.23, 185.21

[56] References Cited

U.S. PATENT DOCUMENTS

| | | | |
|---|---|---|---|
| 5,231,602 | 7/1993 | Radjy et al. | 365/185 |
| 5,337,280 | 8/1994 | Tanagawa et al. | 365/218 |
| 5,347,490 | 9/1994 | Terada et al. | 365/219 |
| 5,365,121 | 11/1994 | Morton et al. | 327/170 |
| 5,442,586 | 8/1995 | Javanifard et al. | 365/189.09 |
| 5,455,794 | 10/1995 | Javanifard et al. | 365/185.18 |
| 5,531,960 | 7/1996 | Lin et al. | 365/185.29 |
| 5,596,526 | 1/1997 | Assar et al. | 365/185.17 |

FOREIGN PATENT DOCUMENTS 2220811  1/1990  United Kingdom ........... G11C 17/00

*Primary Examiner*—Viet Q. Nguyen
*Attorney, Agent, or Firm*—David V. Carlson; Seed and Berry LLP

[57] ABSTRACT

A method for erasing an electrically programmable and erasable non-volatile memory cell having a control electrode, an electrically-insulated electrode and a first electrode. The method provides for coupling the control electrode to a first voltage supply and coupling the first electrode to a second voltage supply. The first voltage supply and the second voltage supply are suitable to cause tunneling of electric charges between the electrically-insulated electrode and the first electrode. The method also provides for a constant current to flow between the second voltage supply and the first electrode of the memory cell for at least part of an erasing time of the memory cell, the constant current having a prescribed value.

23 Claims, 6 Drawing Sheets

METHOD FOR ERASING AN ELECTRICALLY PROGRAMMABLE AND ERASABLE NON-VOLATILE MEMORY CELL

TECHNICAL FIELD

The present invention relates to a method for erasing an electrically programmable and erasable non-volatile memory cell, particularly a Flash EEPROM memory cell. In particular, the present invention relates to a method for erasing memory cells in a Flash EEPROM memory device, and to a Flash EEPROM implementing such method.

BACKGROUND OF THE INVENTION

It is known that Flash Electrically Erasable and Programmable Read Only Memories (Flash EEPROMs) have memory cells which are formed by floating-gate MOSFETs. Each floating-gate MOSFET comprises an N type source and drain region both formed in a spaced-apart condition in a P type semiconductor substrate. The portion of the P type substrate comprised between the source and drain regions forms a channel region, and a floating gate electrode is insulatively placed above the channel region with the interposition of a thin gate oxide layer. A control gate electrode is insulatively disposed over the floating gate electrode.

A Flash EEPROM memory cell is written by means of injection of hot electrons from a portion of the channel region near the drain region into the floating gate. To activate hot-electron injection, the source region is normally grounded, the control gate electrode is biased with a voltage in the range of 9–12 V and the drain region is biased with a voltage in the range of 4–7 V. The negative charge which becomes trapped in the floating gate increases the threshold voltage of the floating-gate MOSFET, i.e., the minimum voltage that must be applied to the control-gate electrode to determine the formation of an N type inversion layer in the channel region.

Erasing of the Flash EEPROM memory cell is achieved by means of Fowler-Nordheim (F-N) tunneling of electrons from the floating gate to the source region through the gate oxide layer. To activate F-N tunneling, a sufficiently high electric potential difference between the source region and the floating gate must be created, to develop a strong electric field in the gate oxide layer. The known expression of the F-N current is:

$$I_{F-N} = A*Eox2*exp(-B/Eox) \quad (1)$$

where A and B are constants; Eox is the electric field in the gate oxide layer, given by:

$$Eox = (VS-VFG-\phi)/Tox \quad (2)$$

where VS is the electric potential applied to the source region, VFG is the electric potential of the floating gate (which is a function of the electric potential of the source and drain regions, of the substrate and of the control gate electrode, and of the charge trapped in the floating gate), $\phi$ is the voltage drop in the source region and Tox is the thickness of the gate oxide layer. The F-N current is a measure of the rate at which electrons are extracted from the floating gate: the higher the F-N current, the shorter the erasing time of the memory cell.

As known, in Flash EEPROMs all the memory cells, or at least large groups of them called memory sectors, have their respective source regions tied to a common source line. Erasing is thus a global operation simultaneously involving a large number of memory cells.

According to a known erasing technique, the electric potential difference between the source regions and the floating gates of the memory cells necessary to activate F-N tunneling is created by biasing the common source line of the memory cells to be erased with a high positive voltage of approximately 12 V, and keeping the control gates grounded; the drain regions are instead left floating.

According to another known erasing technique, the electric potential difference between the source regions and the floating gates of the memory cells necessary to activate F-N tunneling is created by applying to the control gates of the memory cells a negative voltage in the range −8 V to −12 V, generated directly on-chip by means of charge pumps, and biasing the common source line of the memory cells to be erased with a low positive voltage. Conventionally, the low positive voltage to be applied to the common source line of the memory cells to be erased is directly derived from the external power supply VCC of the Flash EEPROM. With this arrangement, it is possible to realize memory devices requiring a single external supply (Single Power Supply memory devices), represented by the conventional VCC supply.

In both cases during erasing, the electric field in the gate oxide layer causes the energy bands at the surface of the source regions of the memory cells to bend; if the electric field is sufficiently high, the band bending exceeds the energy bandgap Eg of the semiconductor material (1.2 eV for silicon) and there is a finite probability for electrons in the valence band to tunnel into the conduction band. Electron-hole pairs are thus generated which give rise to a source-to-substrate current, known as Band-to-Band Tunneling (BBT) current. The expression of the BBT current is:

$$I_{BBT} = C*Esi2*exp(-D/Esi) \quad (3)$$

where C and D are constants and Esi is the electric field at the surface of the source regions of the memory cells, given by:

$$Esi = (VS-VFG-1.2)/(3*Tox) \quad (4)$$

Equations (1)–(4) show that the F-N current and the BBT current depend in a similar way on the same parameters; moreover, BBT current is normally several (typically three) order of magnitudes higher than F-N current. Consequently, if in the attempt to reduce the erasing time of the memory cells the electric field Eox in the gate oxide layer is increased to increase the F-N current, also the BBT current increases.

Another problem related to the value of the electric field Eox in the gate oxide layer is the trapping of negative charges in the gate oxide layer, causing the erasing time of a memory cell to increase with the number of erasing cycles to which the memory cell is submitted. The amount of negative charges trapped in the gate oxide layer increases as the maximum electric field in the gate oxide layer increases.

There is therefore a trade-off between the desire of reducing as far as possible the erasing time and the necessity of limiting the BBT current and the degradation of the gate oxide layer caused by negative charge trapping.

Conventionally, a feedback resistor is provided in series between the VCC supply and the common source line of the memory cells to be erased. The voltage drop across the feedback resistor, due to the BBT current flow, limits the electric potential of the source regions of the memory cells, thus limiting the BBT current. However, the BBT current, and consequently the F-N current and the electric field in the gate oxide layer, has a significant peak at the beginning of erasing. This peak is due to the negative charges trapped in the floating gate of the memory cells when the electric potential of the floating gate of the memory cells is more negative. The BBT current rapidly reduces, and becomes very low in the final phases of erasing.

The electric field in the gate oxide layer is therefore not uniform throughout the erasing process, and is scarcely controlled at the beginning of erasing, when notwithstanding the limiting action of the feedback resistor the electric field has a peak which causes a significant trapping of negative charges in the gate oxide layer.

SUMMARY OF THE INVENTION

In view of the state of art described, it is an object of the present invention to provide a method for erasing an electrically erasable and programmable non-volatile memory cell capable of overcoming the problems inherent to the known methods, particularly in connection with the non-uniform electric field in the gate oxide layer of the memory cell during the erasing process, and specifically with the peak of the electric field at the beginning of the erasing process.

According to the present invention, such object is achieved by means of a method for erasing an electrically programmable and erasable non-volatile memory cell having a control electrode, an electrically-insulated electrode and a first electrode. The method provides for coupling the control electrode to a first voltage supply and coupling the first electrode to a second voltage supply. The first voltage supply and the second voltage supply are suitable to cause tunneling of electric charges between the electrically-insulated electrode and the first electrode. Additionally, the method provides for a constant current to flow between the second voltage supply and the first electrode of the memory cell for at least part of an erasing time of the memory cell, the constant current having a prescribed value.

According to the present invention, erasing of a Flash EEPROM memory cell is accomplished, at least for a part of the erasing process, at a constant source current. During erasing the source current of the memory cell, given by the sum of the Fowler-Nordheim (F-N) current and of the Band-to-Band Tunneling (BBT) current, is substantially equal to the BBT current (which as previously mentioned is several orders of magnitude higher than the F-N current), and the BBT current is in turn a function of the electric field in the gate oxide layer of the memory cell. When a constant source current is present, a constant BBT current is also present, which in turn means a constant electric field in the gate oxide layer. The value of the constant source current is chosen according to the maximum value desired for the electric field. The erasing method of the present invention allows therefore to keep the electric field in the gate oxide layer uniform throughout the entire erasing process, or at least part thereof, with a value depending on the value chosen for the constant source current. Given the value of the threshold voltage shift which the memory cell must undergo to be considered erased, the erasing time of the memory cell is fixed by choosing the value of the constant source current. The electric field peak at the beginning of the erasing process is completely avoided; this allows a reduction in the gate oxide damages caused by trapping of negative charges. The method of the present invention, thanks to the fact that the electric field in the gate oxide layer has a value determined by the constant source current value, is self-adaptive with respect to dimensional variations of the memory cell, such as channel length, channel width and gate oxide thickness; the method of the present invention is also self-adaptive with respect to the memory cell aging, so that the erasing time is constant throughout the life of the memory cell and does not depend on the number of erasing cycles. Also, thanks to the method of the present invention the erasing time and the electric field in the gate oxide layer are independent from variations in the values of the control gate and source voltage supplies.

The erasing method of the present invention can be applied in connection with either one of the erasing techniques previously described. According to the first erasing technique, the control gate of the memory cell is grounded and the source is coupled to a high positive voltage supply of approximately 12 V, and a constant source current is forced to flow from the high positive voltage supply to the source. According to the second erasing technique, the control gate of the memory cell is coupled to a negative voltage supply of approximately −8 V and the source is coupled to a low positive voltage supply of, for example, 5 V, and again a constant source current is forced to flow from the low positive voltage supply to the source of the memory cell.

Also according to the present invention, a circuit is provided for erasing an electrically erasable and programmable non-volatile memory cell having a control electrode, an electrically-insulated electrode and a first electrode. The circuit includes means for coupling the control electrode of the memory cell to a first voltage supply, means for coupling the first electrode of the memory cell to a second voltage supply. The first voltage supply and the second voltage supply are suitable to cause tunneling of electric charges between the electrically-insulated electrode and the first electrode. Additionally, the circuit provides means for determining a constant current flow between said second voltage supply and said first electrode to cause a constant current to flow between the second voltage supply and the first electrode for at least a part of an erasing time of the memory cell.

Also according to the present invention, an electrically erasable and programmable non-volatile memory device is provided having at least one memory sector including an array of memory cells. Each memory cell has a control electrode, an electrically-insulated electrode and a first electrode. The first electrodes of the memory cells of the at least one memory sector are commonly connected to a common line. The device provides means for coupling the control electrodes of the memory cells to a first voltage supply and means for coupling the common line to a second voltage supply, the first voltage supply and the second voltage supply are suitable to cause tunneling of electric charges between the electrically-insulated electrode and the first electrode of the memory cells. Additionally, the device provides means for causing a constant current to flow between said second voltage supply and said common line for at least a part of an erasing time of the memory cells of the at least one memory sector.

The first voltage supply and the second voltage supply can be respectively a ground voltage supply and a high positive voltage supply generated externally to the memory device.

In a preferred embodiment, the first voltage supply and the second voltage supply can be respectively a negative voltage supply generated internally to the memory device, and a low positive voltage. The low positive voltage can be a power supply of the memory device or, preferably, can be generated internally to the memory device. For example, the low positive voltage can be generated by means of a charge pump circuit provided in the memory device to generate a programming voltage for electrically programming the memory cells.

BRIEF DESCRIPTION OF THE DRAWINGS

These and other features of the present invention will be made more evident by the following detailed description of some particular embodiments, illustrated as non-limiting examples in the annexed drawings.

DETAILED DESCRIPTION OF THE INVENTION

Figure 1:
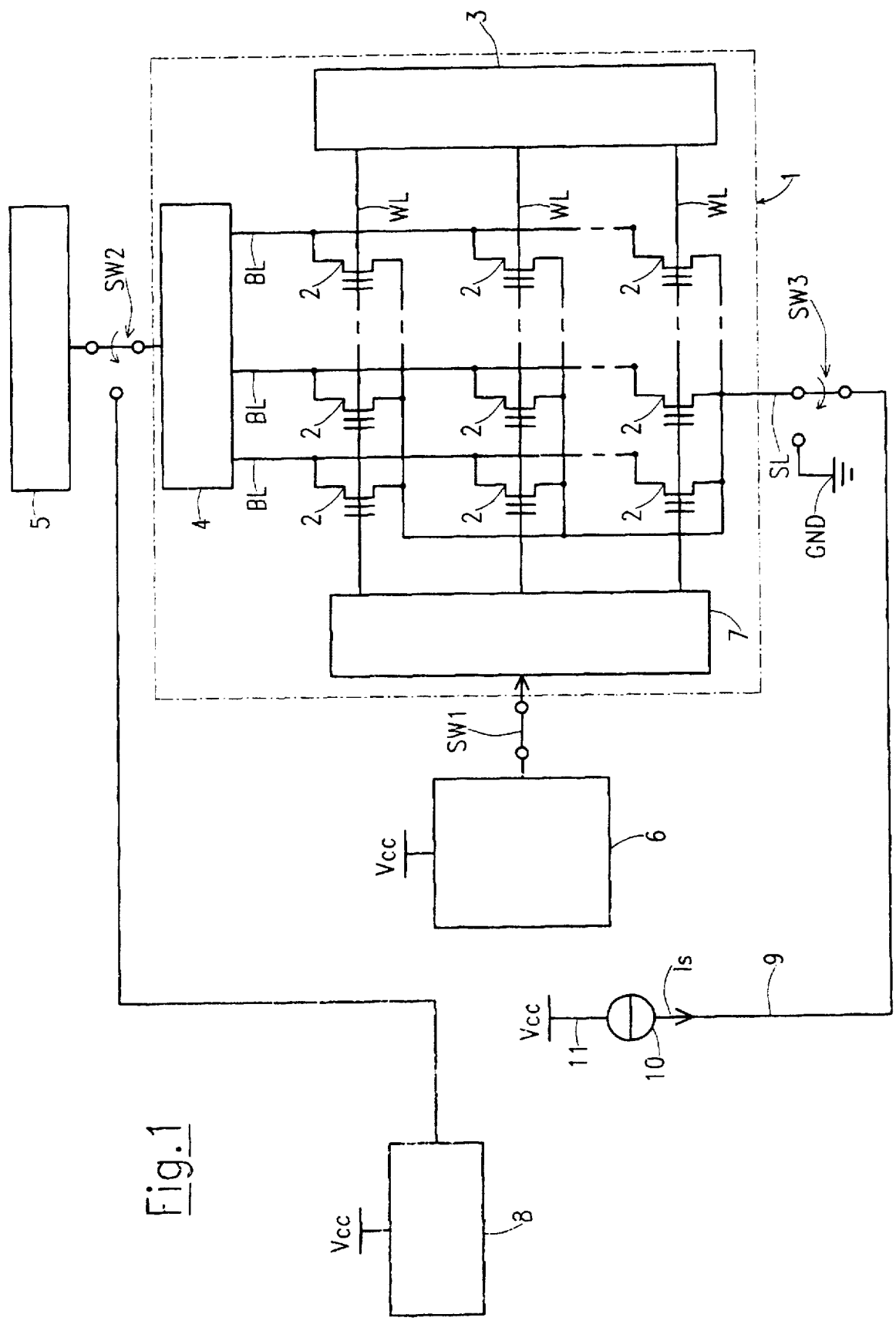
FIG. 1 is a schematic diagram of a Flash EEPROM according to a first embodiment of the present invention.

A first embodiment of a Flash EEPROM is schematically shown in FIG. 1. The Flash EEPROM comprises an array 1 of Flash electrically erasable and programmable non-volatile memory cells 2 arranged in rows (word lines) WL and columns (bit lines) BL. Each memory cell 2 is a floating-gate MOSFET having the drain connected to a respective one of the bit lines BL, source commonly connected, together with the sources of all the other cells 2, to a common source line SL, an electrically insulated floating-gate, and a control gate connected to a respective one of the word lines WL.

Also schematically shown in FIG. 1 are a row decoder 3 and a column decoder 4 which allow the selection of one word line WL and one bit line BL, respectively. The detailed circuit structure of the row and column decoders is not shown, since these circuits are conventional.

The column decoder 4 electrically connects one of the bit lines BL to a sensing circuit 5 which is, also conventional, and therefore not described in further detail.

The Flash EEPROM of the first embodiment implements the second erasing technique previously described. To this purpose, a negative voltage generator 6 is provided for supplying a negative voltage to the word lines WL during erasing of the array 1 of memory cells. The negative voltage generator 6 comprises a negative charge pump circuit designed to generate a negative voltage with values ranging from −8 V to −12 V starting from the voltage provided by an external power supply, indicated in the drawings by VCC, which typically is a 5 V or a 3 V supply. An output of the negative voltage generator 6 is coupled to the word lines WL of the array 1 through a first switch SW1 and a conventional decoupling circuit 7. The decoupling circuit 7 is such that the word lines WL are short-circuited together when the switch SW1 is closed and the negative voltage generator 6 is generating a negative voltage: in this way all the word lines WL are commonly supplied with the negative voltage generated by the negative voltage generator 6. When switch SW1 is open, i.e., no negative voltage is supplied to the input of the decoupling circuit 7, the word lines are not short-circuited together, to allow the row decoder 3 to select only one of the word lines WL at a time.

The Flash EEPROM also comprises a positive voltage generator 8, used for supplying a positive voltage of approximately 5–6 V to the bit lines BL during a programming process of the memory cells 2. The positive voltage generator 8 comprises a positive charge pump circuit which, starting from the external power supply VCC, generates the desired bit line programming voltage. A second switch SW2 electrically couples the output of the column decoder 4 either to the sensing circuit 5 or to the output of the positive voltage generator 8.

A third switch SW3 selectively couples the common source line SL of the array 1 either to a ground voltage GND or to an output 9 of a constant erase source current device 10, ideally a current generator, having an input 11 connected to the external power supply VCC. During the erasing process, the constant erase source current device 10 forces a constant source current IS to flow from the external power supply VCC to the common source line SL, and thus to the sources of the memory cells 2.

Figure 2:
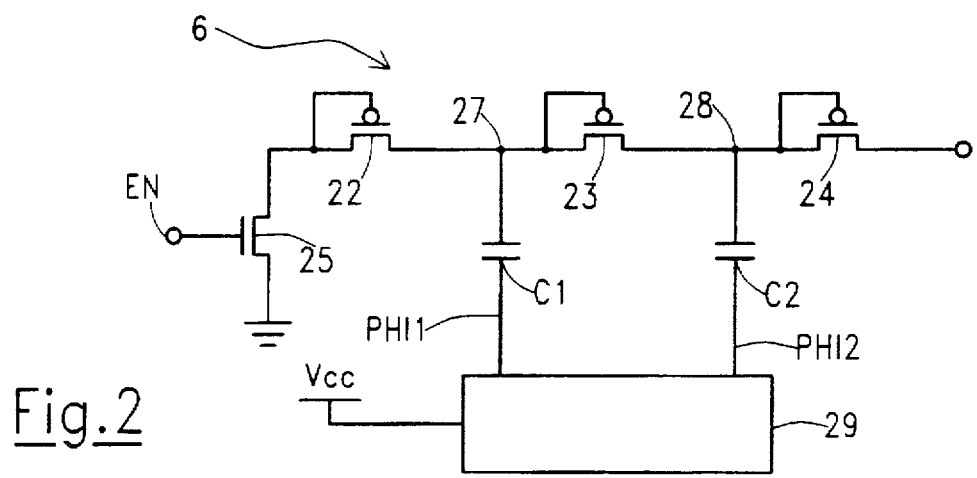
FIG. 2 is a schematic circuit diagram of a negative voltage generator of the Flash EEPROM of FIG. 1.

FIG. 2 schematically exemplifies a circuit diagram of the negative voltage generator 6. A negative charge pump circuit is formed by a chain of diode-connected P channel MOSFETs 22, 23 and 24. The first MOSFET 22 of the chain has the drain connected to ground through an N channel MOSFET 25 whose gate is controlled by an enable signal EN. A first capacitor C1 has one plate connected to a common node 27 between MOSFETs 22 and 23, and the other plate supplied with a first clock signal PHI1. A second capacitor C2 has one plate connected to a common node 28 between MOSFETs 23 and 24, and the other plate supplied with a second clock signal PHI2. The clock signals PHI1, PHI2 are generated by a conventional clock generator 29, supplied by the external voltage supply VCC. The clock signals PHI1, PHI2 are digital signals switching between ground and the external power supply VCC, and they are substantially in phase opposition. The source of MOSFET 24 forms the output of the negative voltage generator 6.

In READ mode, the negative voltage generator 6 and the positive voltage generator 8 are deactivated, the first switch SW1 is open, the second switch SW2 couples the output of the column decoder 4 to the sensing circuit 5, and the third switch SW3 couples the common source line SL to ground. The row decoder 3 raises the potential of the selected word line WL to VCC, while the potential of all the other word lines is kept to ground. The selected bit line BL is biased at approximately 1 V, while all the other bit lines are left floating. The addressed memory cell thus has the VCC value on its control gate, approximately 1 V on its drain, and 0 V on its source.

In PROGRAM mode, the negative voltage generator 6 is deactivated, the positive voltage generator 8 is activated, the first switch SW1 is open, the second switch SW2 couples the output the column decoder 4 to the output of the positive voltage generator 8, and the third switch SW3 couples the common source line SL to ground. The row decoder 3 raises the potential of the selected word line WL (the one containing the memory cell to be programmed) to a high positive voltage of approximately 9 V–12 V. The potential of the selected bit line BL is raised to a positive voltage of 5–6 V generated by the positive voltage generator 8, while all the other bit lines are left floating. The addressed memory cell thus has 9 V–12 V on its control gate, a voltage of approximately 5–6 V on its drain, and 0 V on its source.

In ERASE mode, the positive voltage generator 8 is deactivated, the row decoder 3 and the column decoder 4 are disabled so that the bit lines BL are left floating. The first switch SW1 is closed and the negative voltage generator 6 is activated, so that all the word lines WL are supplied with the negative voltage of approximately –8 V to –12 V generated by the negative voltage generator 6. The third switch couples the common source line SL to the output 9 of the constant erase source current device 10, which forces a constant current IS to flow from the external power supply VCC to the common source line SL, and thus to the sources of the memory cells 2.

During erasing, the source current of a memory cell is equal to the Fowler-Nordheim (F-N) current plus the Band-to-Band Tunneling (BBT) current, and is substantially equal to the BBT current, which is normally at least three orders of magnitude higher than the F-N current. The expression of the BBT current is:

$$I_{BBT} = C * Esi2 * exp(-D/Esi)$$

where C and D are constants and Esi is the electric field at the surface of the source regions of the memory cells, given by:

$$Esi = (VS - VFG - 1.2)/(3*Tox),$$

where VS and VFG are the potential of the source electrode and of the floating gate electrode, respectively. The expression of the F-N current is instead:

$$I_{F-N} = A * Eox2 * exp(-B/Eox)$$

where A and B are constants, and Eox is the electric field in the gate oxide layer, given by:

$$Eox = (VS - VFG - \phi)/Tox$$

where $\phi$ is the voltage drop in the source region and Tox is the thickness of the gate oxide layer.

During erasing, the current flowing in the common source line SL is therefore equal to the sum of the source currents of all the individuals memory cells 2 of the array 1. The constant erase source current device 10, by forcing a constant current IS to flow in the common source line SL, sets a predetermined value for the electric field Eox in the gate oxide layer of the memory cells 2. The value of the constant current IS forced by the device 10 is chosen by the designer taking into account the number of memory cells in the array 1, and according to a desired trade-off between the value of the electric field Eox and the erasing time of the memory cells. The erasing time of the memory cells depends on the threshold voltage shift which the memory cells must undergo. In choosing a desired value for the electric field Eox compatible with a not excessively long erasing time, the designer will consider that the larger the array 1 is the higher the constant current IS will be. The potential VS of the sources of the memory cells automatically sets to a value compatible with the chosen value of Eox; Eox remains constant substantially throughout the entire erasing process, and as electrons are extracted from the floating gate of the memory cells, the potential VS of the source electrodes automatically raises to compensate for the decrease (in absolute value) of the potential of the floating gate electrodes.

Figure 3:
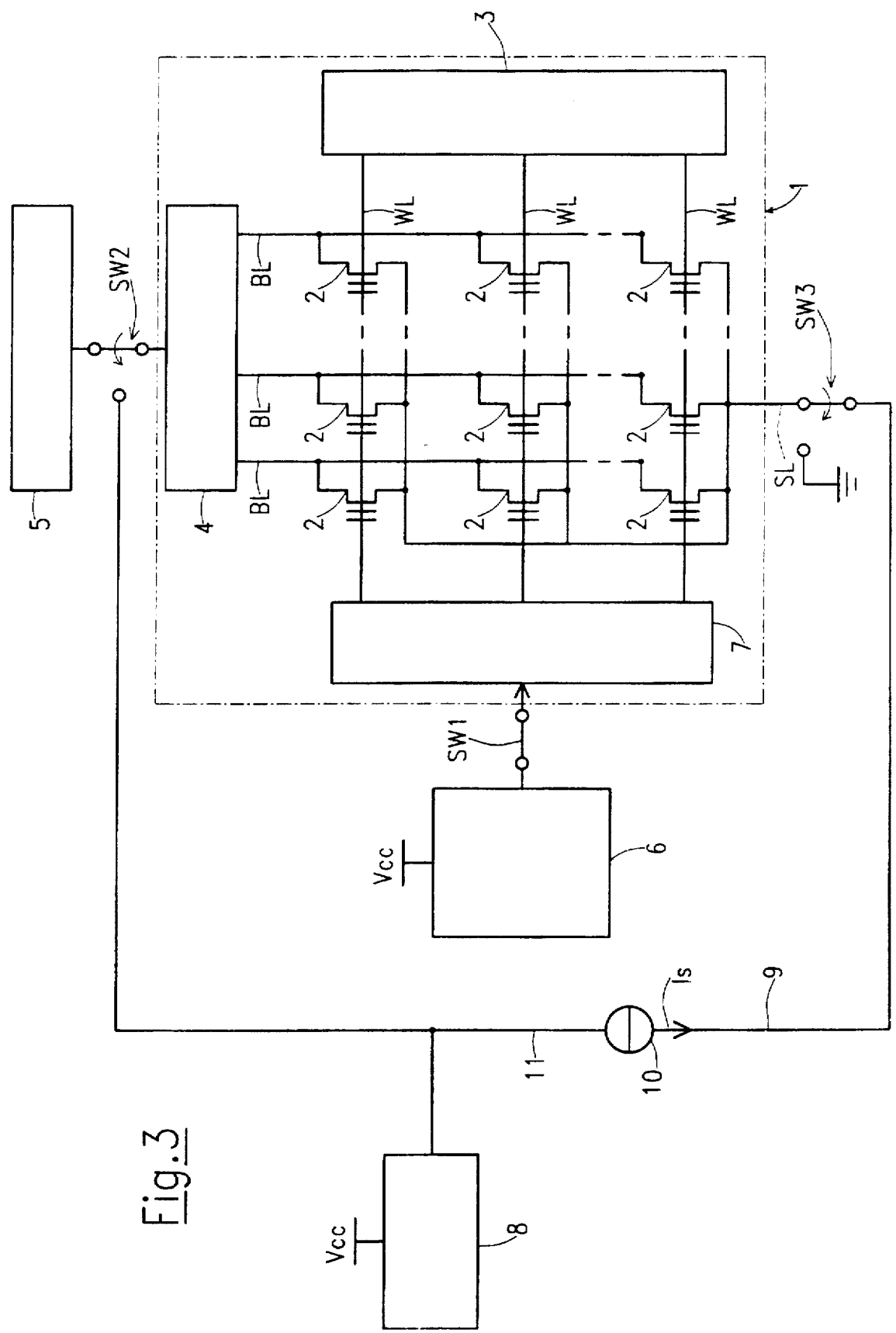
FIG. 3 is a schematic diagram of a Flash EEPROM according to a second embodiment of the present invention.

In FIG. 3, referring to a Flash EEPROM according to a second embodiment of the invention, the input 11 of the constant erase source current device 10 is not connected to the external supply VCC, but to the output of the positive voltage generator 8; the positive voltage generator 8 not only serves to generate the voltage to be applied in PROGRAM mode to the bit lines BL, but it is also used as a voltage supply for the source electrodes of the memory cells in ERASE mode. This embodiment is particularly suitable for 3 V Flash EEPROMs, wherein the 3 V external supply would be too low to allow short erasing times or even to trigger F-N tunneling.

Figure 4:
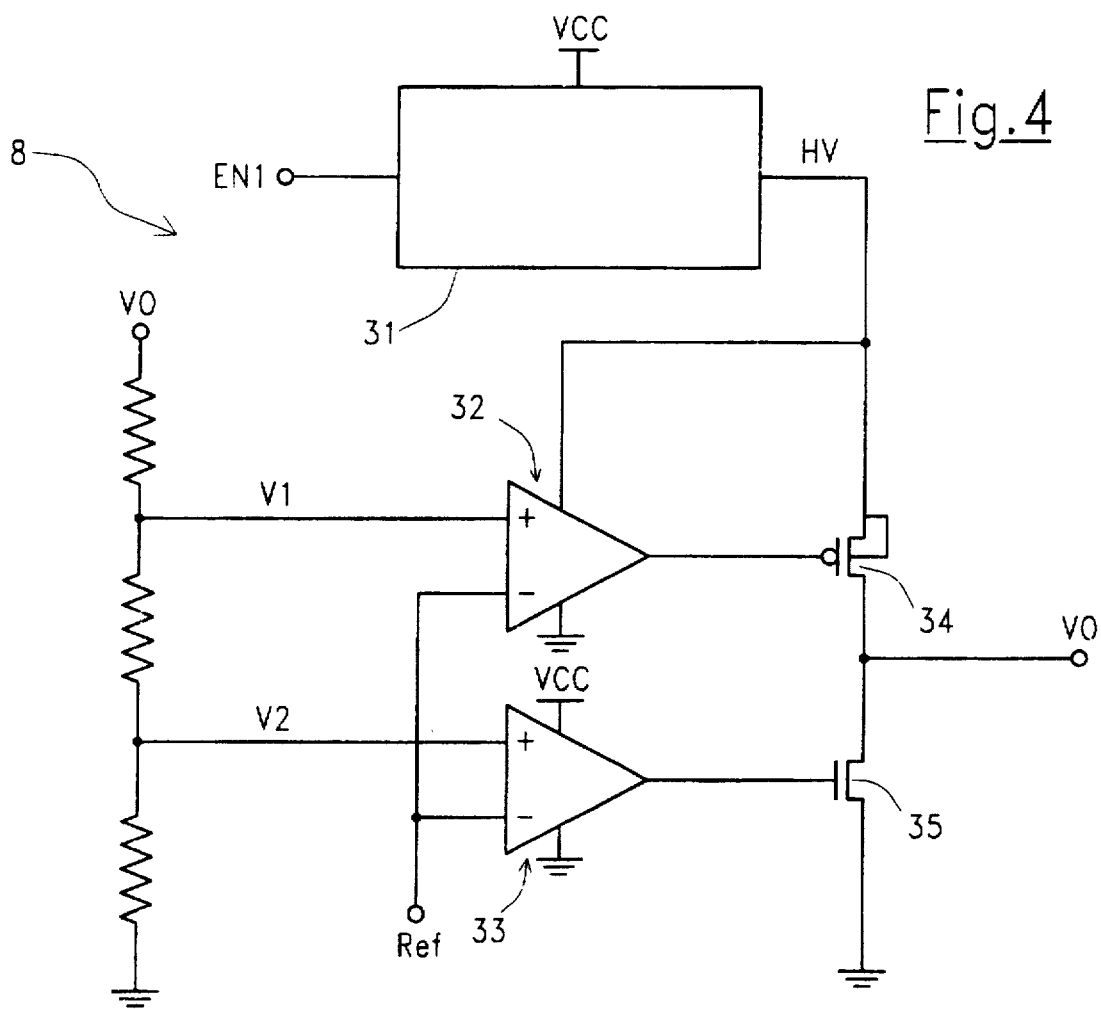
FIG. 4 is a schematic diagram of a positive voltage generator of the Flash EEPROM of FIG. 3.

FIG. 4 exemplifies a possible practical structure of the positive voltage generator 8. The positive voltage generator 8 comprises a conventional positive charge pump 31, which when activated by a signal EN1 generates a positive voltage HV higher than the external supply VCC, and a voltage regulation circuit which provides a regulated positive voltage output VO of, for example, 5–6 V independent from the VCC value.

The regulation circuit comprises two conventional differential amplifiers 32, 33. The positive voltage HV supplies the differential amplifier 32, which has an inverting input connected to a reference voltage Ref and a non-inverting input supplied with a voltage V1 derived by partition from the regulated output voltage VO. The output of differential amplifier 32 drives a P channel MOSFET 34 with source connected to the positive voltage HV and drain connected to the regulated voltage output VO. Differential amplifier 33 is supplied by the external supply VCC and has an inverting input connected to the reference voltage Ref and a non-inverting input supplied with a voltage V2 also derived by partition from the voltage VO. The output of differential amplifier 33 drives an N channel MOSFET 35 with drain connected to VO and source connected to ground.

Figure 5:
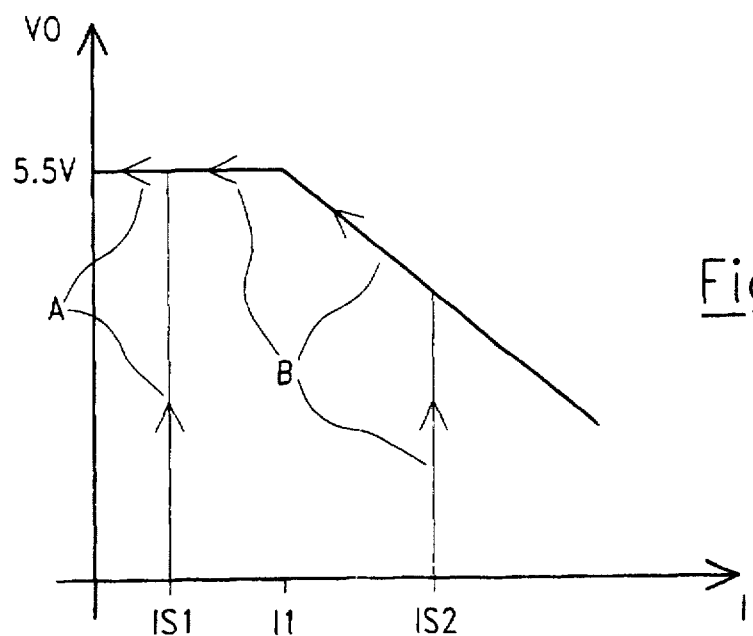
FIG. 5 is a diagram showing an output characteristic of the positive voltage generator of FIG. 4.

FIG. 5 shows the output characteristic of the positive voltage generator 8 of FIG. 4. The characteristic is piecewise linear, and it has been assumed that the regulated output voltage VO remains equal to the regulated open-circuit value of 5.5 V, independent from VCC, until the current drawn from the charge pump 31 is lower than a maximum current I1 of for example 2.5 mA; for higher currents, VO decreases linearly with a slope equal to the output resistance of the charge pump 31.

It should be understood that only if the constant erase source current IS forced by the constant erase source current device 10 is lower than the maximum current I1 the entire erasing process can actually be performed at a constant current (curve A in FIG. 5, IS=IS1), because the regulated voltage VO remains equal to its open-circuit value. If a higher erase source current IS=IS2 is chosen to shorten the erasing time, only part of the erasing process will be performed at a constant current, namely until the source voltage necessary to sustain the constant erase current reaches the value of VO for the current IS2 (curve B in FIG. 5). For the remaining part of the erasing process the voltage of the sources of the memory cells will move on the output characteristic curve of the positive voltage generator; however, also in this case the initial peak of the electric field in the gate oxide layer of the memory cells is completely avoided. The initial peak is avoided because, in the initial phases of the erasing process, the electric field value is again determined by the value of the constant erase source current IS.

Figure 6:
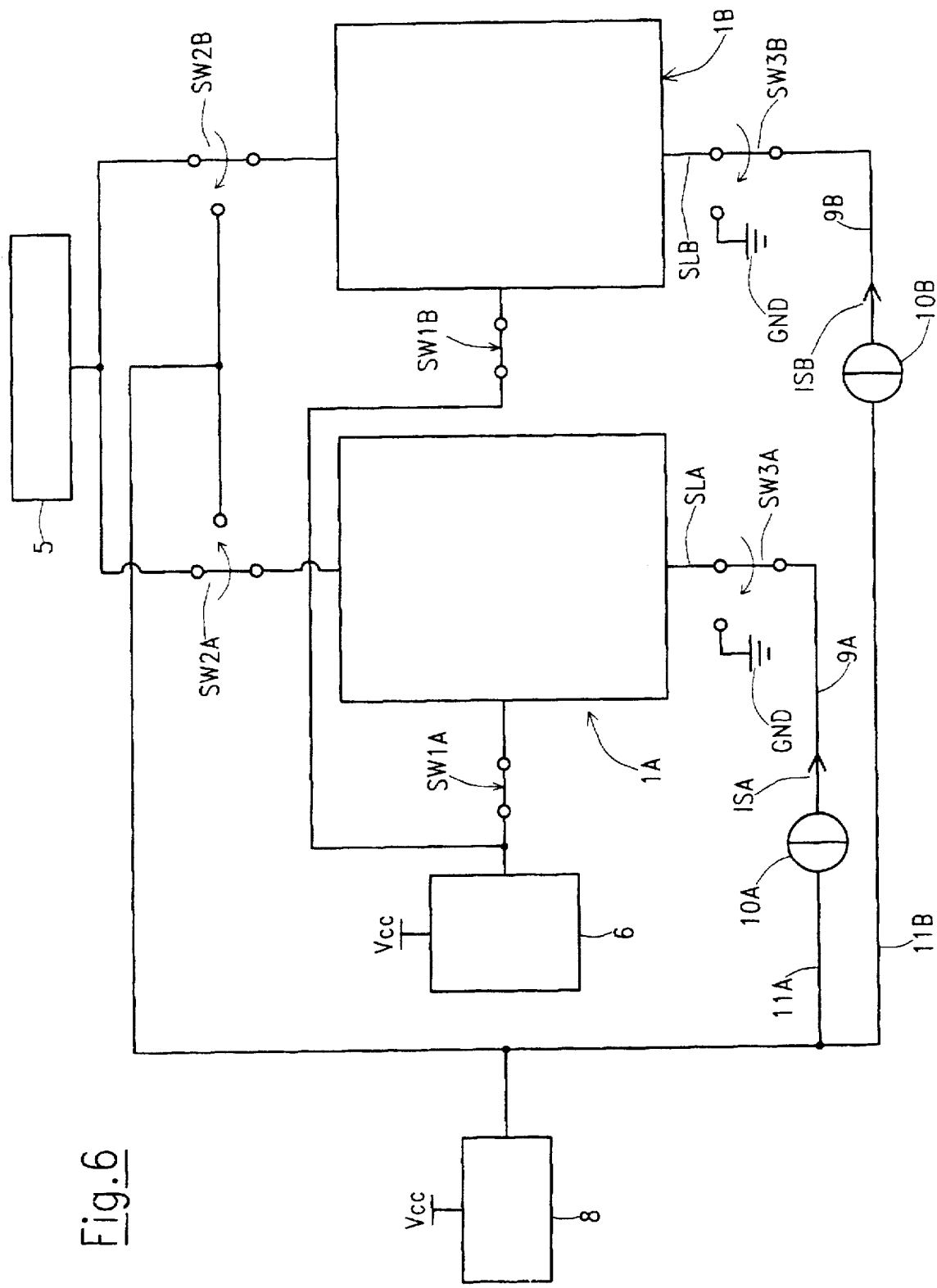
FIG. 6 is a schematic diagram of a Flash EEPROM according to a third embodiment of the present invention.

FIG. 6 relates to the case of a Flash EEPROM having two memory sectors. Each memory sector comprises an array 1A, 1B of memory cells, similar to the array 1 of FIGS. 1 and 2, in particular comprising a plurality of word lines and bit lines, a row decoder and a column decoder. The two memory sectors 1A, 1B have distinct common source lines SLA, SLB which can be coupled, through a respective switch means SW3A, SW3B, either to a ground voltage GND or to an output 9A, 9B of a respective constant erase source current device 10A, 10B. In the shown example, the input 11A, 11B of the constant erase source current devices 10A, 10B is connected to an output of a positive voltage generator 8, as in the embodiment of FIG. 2, but it should be understood that the inputs 11A, 11B of the constant erase source current devices 10A, 10B could also be directly connected to an external supply VCC, as in the embodiment of FIG. 1. The memory device also includes a negative voltage generator 6 whose output is coupled to the memory sectors 1A, 1B through respective switch means SW1A, SW1B. The output of the column decoder of each sector 1A, 1B can be selectively coupled, through a respective switch means SW2A, SW2B, either to a sensing circuit 5 or to an the output of the positive voltage generator 8.

The two memory sectors 1A, 1B can be erased individually; the constant erase source current devices 10A, 10B forces a respective current ISA, ISB to flow from the positive voltage generator 8 to the common source line SLA, SLB of the memory sectors 1A, 1B, respectively. The two currents ISA, ISB can be equal to each other, or more generally they can be different, for example to take into account different sizes of the two memory sectors.

Figure 7:
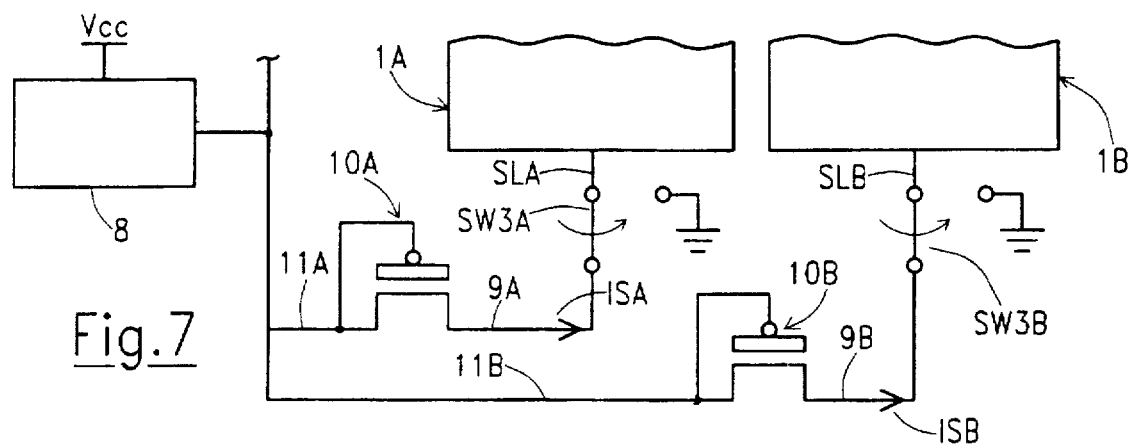
FIG. 7 shows a first embodiment of devices for forcing a constant erase current for the Flash EEPROM of FIG. 6.

FIG. 7 shows in detail a first embodiment of the constant erase source current devices 10A, 10B. Each one of the devices 10A, 10B comprises a P channel depletion MOSFET with the drain connected to the common source line SLA, SLB of the associated memory sector, and with the source and gate tied to the output of the positive voltage generator 8. The P channel depletion MOSFETs 10A, 10B operate in saturation condition, providing a constant drain current substantially independent from their drain-source voltage. MOSFETs 10A and 10B can have different sizes to determine different erase source currents for the two memory sectors, for example to take into account different sector sizes.

Figure 8:
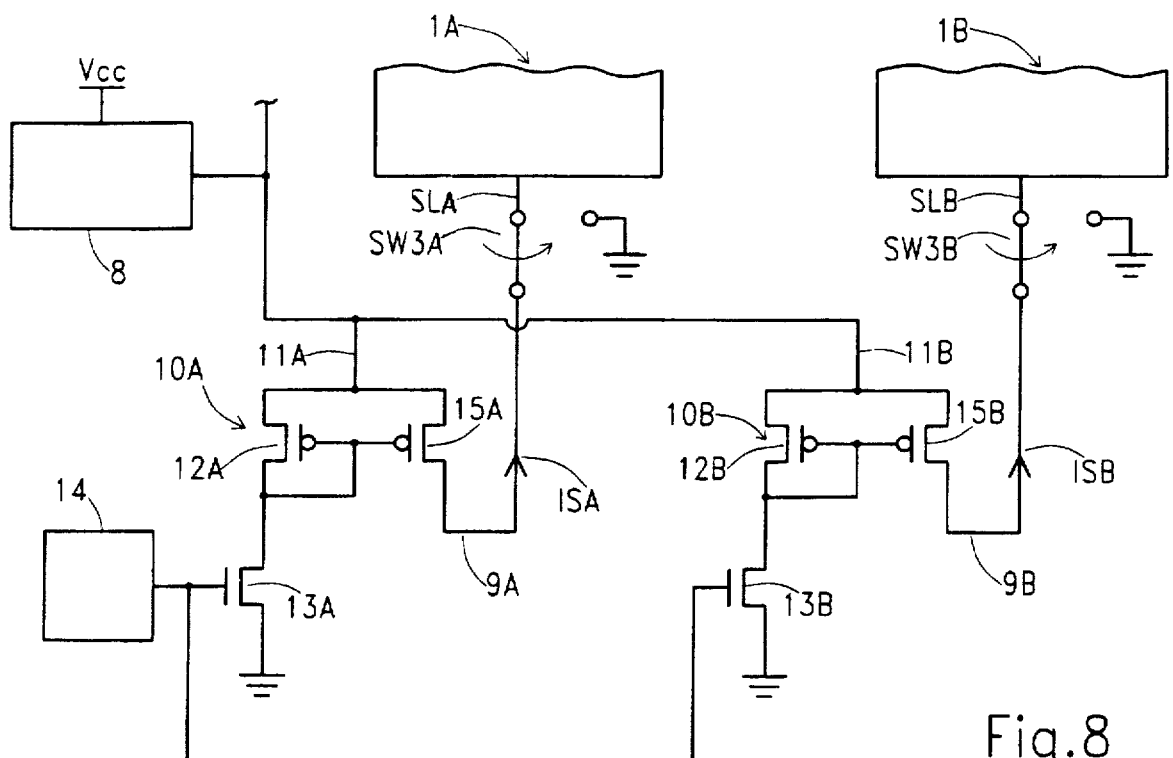
FIG. 8 shows a second embodiment of devices for forcing a constant erase current for the Flash EEPROM of FIG. 6.

FIG. 8 shows in detail a second embodiment of the constant erase source current devices 10A, 10B. Each one of the devices 10A, 10B comprises a current-mirror circuit having a first circuit branch including a P channel MOSFET 12A, 12B with source connected to the output of the positive voltage generator 8, gate tied to drain and drain connected to the drain of an N channel MOSFET 13A, 13B which has source connected to ground and gate controlled by a conventional biasing circuit 14; a second circuit branch of the current-mirror circuits 10A, 10B comprises a P channel MOSFET 15A, 15B with source connected to the output of the positive voltage generator 8, gate tied to the gate of the P channel MOSFET 12A, 12B in the first circuit branch and drain connected to the switch means SW3A, SW3B.

Figure 9:
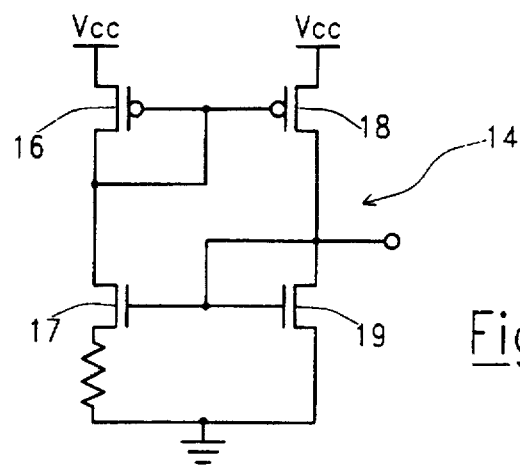
FIG. 9 is a circuit diagram showing a practical embodiment of a constant bias circuit for the constant erase current devices of FIG. 8.

The biasing circuit 14 is unique for all the memory sectors. As shown in FIG. 9, a possible biasing circuit is formed by a current-mirror circuit comprising a first circuit branch and a second circuit branch. The first branch comprises a P channel MOSFET 16 with the source connected to VCC and gate tied to the drain, an N channel MOSFET 17 in series to MOSFET 16 and a resistor R in series between the source of MOSFET 17 and ground. The second branch comprises a P channel MOSFET 18 with the source connected to VCC and the gate connected to the gate of MOSFET 16, and an N channel MOSFET 19 with the drain tied to the gate and connected to the gate of MOSFET 17 and the source connected to ground. The drain of MOSFET 19 drives the gate of MOSFETs 13A and 13B in the constant erase source current devices 10A, 10B.

The biasing circuit 14 generates a constant bias voltage for the gates of MOSFETs 13A, 13B. MOSFETs 13A, 13B, biased by the constant bias voltage, determine a constant current flow in the first circuit branch of the current-mirror circuits 10A, 10B. The currents ISA, ISB flowing in the second branch of the current-mirror circuit 10A, 10B are proportional to the currents flowing in the first branch of the circuits 10A, 10B. The aspect ratios of MOSFETs 15A and 15B can be different, to have different erase source currents ISA and ISB.

Figure 10:
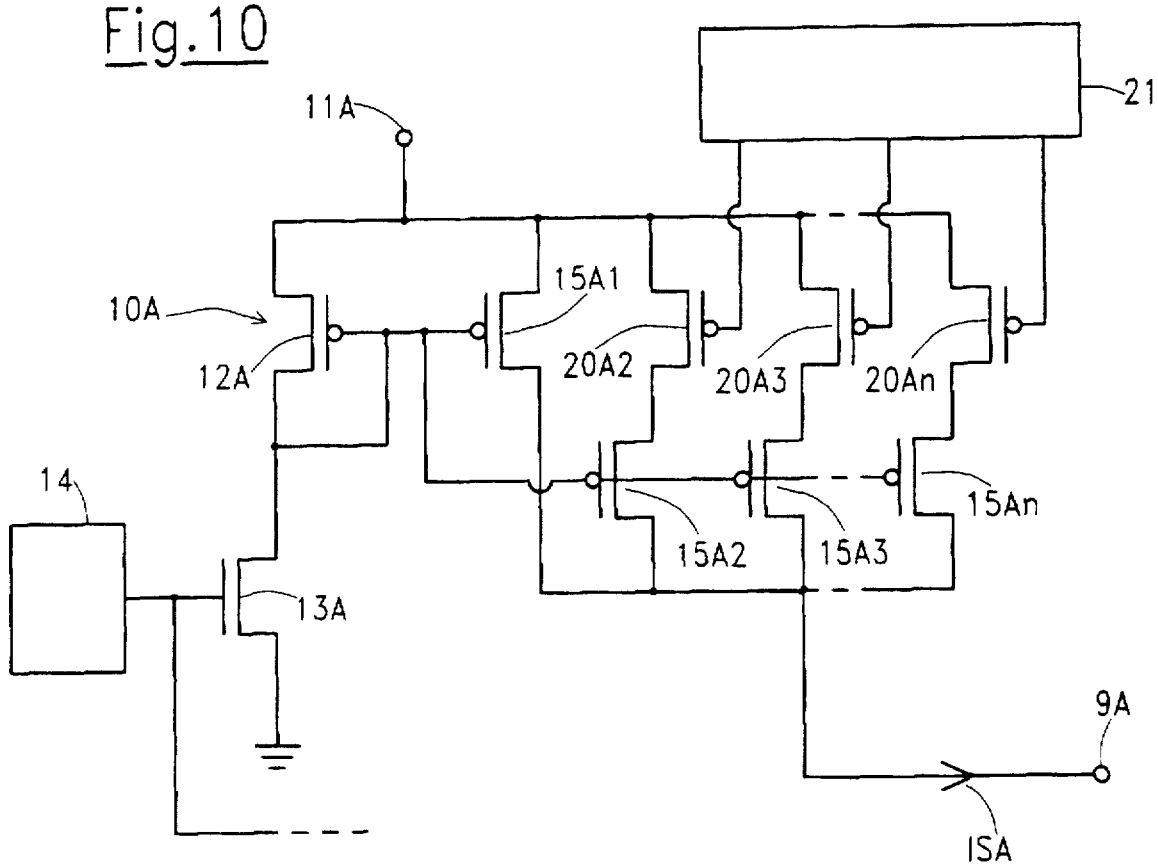
FIG. 10 is a circuit diagram showing a third embodiment of a device for forcing a constant erase current.

FIG. 10 shows a variation of the embodiment of the constant erase source current devices 10A, 10B of FIG. 8. In parallel to the second branch of the current-mirror circuit 10A, a plurality of n−1 additional branches is provided, each additional branch comprising a P channel MOSFET 15A2–15An with the drain connected to the output 9A of the circuit and the gate connected to the gate of the P channel MOSFET 12A in the first branch. Each one of MOSFETs 15A2–15An is coupled to the input 11A of the circuit through a respective P channel MOSFET 20A2–20An, individually driven by a conventional programmable logic circuit 21 internal to the Flash EEPROM. The presence of additional branches in parallel to the second branch of the current-mirror circuit, with the additional branches being selectively activatable, makes it possible to vary the mirror ratio of the current-mirror circuit, and consequently to vary the value of the constant erase source current ISA. The programmable logic circuit can for example comprise non-volatile memory registers capable of permanently storing the activation configuration of the additional branches: in this way, during the in-factory testing of the memory devices, it is possible to configure various configurations to set different values for the constant erase source currents ISA, ISB, for example to provide memory devices with different erasing times. This is useful when it is desired that one or more of the memory sectors of the Flash EEPROM emulate an EEPROM memory device, which as known features shorter erasing times than Flash EEPROMs. The programmable logic circuit can also comprise temporary set-reset latches useful for test purposes to temporarily vary the value of the constant erase source currents for the different memory sectors.

It will be appreciated that, although specific embodiments of the invention have been described herein for purposes of illustration, various modifications may be made without departing from the spirit and scope of the invention. Accordingly, the invention is not limited except as by the appended claims.

We claim:

1. A method for erasing an electrically programmable and erasable non-volatile memory cell having a control electrode, an electrically-insulated electrode and a first electrode, comprising the steps of:

coupling the control electrode to a first voltage supply;

coupling the first electrode to a second voltage supply, the first voltage supply and the second voltage supply being suitable to cause tunneling of electric charges between the electrically-insulated electrode and the first electrode; and providing for a constant current to flow between the second voltage supply and the first electrode of the memory cell for at least part of an erasing time of the memory cell, said constant current having a prescribed value determined on the basis of a maximum allowed value of an electric field in an insulation layer interposed between the electrically-insulated electrode and the first electrode.

2. The method according to claim 1 wherein said maximum allowed value of the electric field is a value suitable to simultaneously minimize the erasing time of the memory cell and a damaging of the insulation layer.

3. The method according to claim 1 wherein the first voltage supply is a ground reference voltage and the second voltage supply is a positive voltage.

4. The method according to claim 1 wherein the first voltage supply is a negative voltage and the second voltage supply is a positive voltage.

5. A circuit for erasing an electrically erasable and programmable non-volatile memory cell having a control electrode, an electrically-insulated electrode and a first electrode, comprising:

first switch means for coupling the control electrode of the memory cell to a first voltage supply;

second switch means for coupling the first electrode of the memory cell to a second voltage supply, the first voltage supply and the second voltage supply being suitable to cause tunneling of electric charges between the electrically-insulated electrode and the first electrode; and generator means, said generator means being provided to cause a constant current to flow between the second voltage supply and the first electrode for at least a part of an erasing time of the memory cell, said constant current having a prescribed value determined on the basis of a maximum allowed value of an electric field in an insulation layer interposed between the electrically-insulated electrode and the first electrode.

6. The circuit according to claim 5 wherein the first voltage supply is a ground reference voltage and the second voltage supply is a positive voltage.

7. The circuit according to claim 5 wherein the first voltage supply is a negative voltage, and the second voltage supply is a positive voltage.

8. The circuit according to claim 5 wherein said generator means for causing a constant current to flow between said second voltage supply and the first electrode of the memory cell further include a transistor operated in saturation condition.

9. The circuit according to claim 8 wherein said transistor is a P channel depletion MOSFET with a first terminal coupled to the second voltage supply, a second terminal coupled to the first electrode of the memory cell and a control terminal connected to the first terminal.

10. The circuit according to claim 5 wherein said generator means for causing a constant current to flow between said second voltage supply and the first electrode of the memory cell further includes a current-mirror circuit having an input coupled with said second voltage supply and an output coupled with the first electrode of the memory cell and having a first circuit branch traversed by a reference current and a second circuit branch traversed by said constant current which is proportional to said reference current.

11. An electrically erasable and programmable non-volatile memory device comprising:

at least one memory sector including an array of memory cells, each memory cell having a control electrode, an electrically-insulated electrode and a first electrode, the first electrodes of the memory cells of said at least one memory sector being commonly connected to a common line;

first switch means for coupling the control electrodes of the memory cells to a first voltage supply;

second switch means for coupling the common line to a second voltage supply, the first voltage supply and the second voltage supply being suitable to cause tunneling of electric charges between the electrically-insulated electrode and the first electrodes of the memory cells; and generator means for causing a constant current to flow between said second voltage supply and said common line for at least a part of an erasing time of the memory cells of the at least one memory sector, said constant current having a prescribed value determined on the basis of a maximum allowed value of an electric field in an insulation layer interposed between the electrically-insulated electrode and the first electrodes of the memory cells of the at least one memory sector.

12. The electrically erasable and programmable non-volatile memory device according to claim 11 wherein the first voltage supply is a ground reference voltage and the second voltage supply is a positive voltage supply.

13. The electrically erasable and programmable non-volatile memory device according to claim 11 wherein the first voltage supply is a negative voltage generated by a negative voltage generator internal to the memory device, and the second voltage supply is a positive voltage.

14. The electrically erasable and programmable non-volatile memory device according to claim 13 wherein the negative voltage generator is a negative charge pump.

15. The electrically erasable and programmable non-volatile memory device according to claim 14 wherein the second voltage supply is an external voltage supply of the memory device.

16. The electrically erasable and programmable non-volatile memory device according to claim 13 wherein the second voltage supply is generated by a positive voltage generator internal to the memory device provided to generate a programming voltage for programming the memory cells of the at least one memory sector.

17. The electrically erasable and programmable non-volatile memory device according to claim 16 wherein the positive voltage generator further includes a positive charge pump and a voltage regulator circuit for regulating an output voltage of the positive charge pump.

18. The electrically erasable and programmable non-volatile memory device according to claim 11 wherein said generator means for causing a constant current to flow between said second voltage supply and said common line further includes a transistor operated in saturation condition.

19. The electrically erasable and programmable non-volatile memory device according to claim 18 wherein said transistor is a P channel depletion MOSFET with a first terminal coupled to the second voltage supply, a second terminal coupled to the common line and a control terminal connected to the first terminal.

20. The electrically erasable and programmable non-volatile memory device according to claim 11 wherein said generator means for causing a constant current to flow between said second voltage supply and said common line further includes a current-mirror circuit having an input coupled with said second voltage supply and an output coupled with said common line, and having a first circuit branch traversed by a reference current and a second circuit branch traversed by said constant current which is proportional to said reference current.

21. The electrically erasable and programmable non-volatile memory device according to claim 20 wherein said generator means for causing a constant current to flow between said second voltage supply and said common line further includes a biasing circuit associated to the first circuit branch of the current-mirror circuit for causing said reference current to flow in the first circuit branch of the current-mirror circuit.

22. The electrically erasable and programmable nonvolatile memory device according to claim 11 further including a plurality of memory sectors, the memory cells in each memory sector having the first electrodes commonly connected to a respective common line distinct from the common line of the other memory sectors, each memory sector having associated therewith a respective means for causing a constant current to flow between the second voltage supply and the respective common line of the memory sector.

23. The electrically erasable and programmable nonvolatile memory device according to claim 22 wherein for a given memory sector, said constant current has a value depending on a size of said memory sector and on a prescribed erasing time for the memory sector.

* * * * *